US012444595B2

(12) United States Patent
Quarmby et al.

(10) Patent No.: US 12,444,595 B2
(45) Date of Patent: Oct. 14, 2025

(54) ION SOURCES FOR IMPROVED ROBUSTNESS

(71) Applicant: Thermo Finnigan LLC, San Jose, CA (US)

(72) Inventors: Scott T. Quarmby, Round Rock, TX (US); Edward McCauley, Cedar Park, TX (US)

(73) Assignee: Thermo Finnigan LLC, San Jose, CA (US)

( * ) Notice: Subject to any disclaimer, the term of this patent is extended or adjusted under 35 U.S.C. 154(b) by 544 days.

(21) Appl. No.: 18/050,532

(22) Filed: Oct. 28, 2022

(65) Prior Publication Data

US 2024/0145228 A1 May 2, 2024

(51) Int. Cl.
*H01J 49/24* (2006.01)
*C23C 14/06* (2006.01)
*C23C 14/14* (2006.01)
*H01J 49/10* (2006.01)

(52) U.S. Cl.
CPC .......... *H01J 49/24* (2013.01); *C23C 14/0641* (2013.01); *C23C 14/14* (2013.01); *H01J 49/10* (2013.01)

(58) Field of Classification Search
CPC .. H01J 49/04; H01J 49/10; H01J 49/14; H01J 49/24; H01J 37/3171; H01J 37/08; C23C 14/0641; C23C 14/14; C23C 14/564; C23C 14/48
See application file for complete search history.

(56) References Cited

U.S. PATENT DOCUMENTS

| | | | | |
|---|---|---|---|---|
| 4,135,094 | A * | 1/1979 | Hull | H01J 49/14 313/359.1 |
| 2007/0096022 | A2 | 5/2007 | Marriott | |
| 2008/0121811 | A1* | 5/2008 | Horsky | C23C 14/564 250/424 |

* cited by examiner

*Primary Examiner* — David E Smith
*Assistant Examiner* — Hsien C Tsai

(57) ABSTRACT

A mass spectrometer system includes a vacuum manifold; an ion source positioned within the vacuum manifold for ionizing a sample; a mass analyzer for analyzing sample ions; a high vacuum pump connected to the vacuum manifold operable to maintain the pressure within the vacuum manifold at an operating pressure; and a controller configured to raise the pressure in the ion source to a sputtering pressure by supplying a flow of a sputtering gas and either reducing a speed of a high vacuum pump or isolating the ion source from the high vacuum pump; cause a conducting material to be sputtered on a surface of the ion source; and reduce the pressure in the ion source to an operating pressure by reducing the flow of the sputtering gas and either increasing the speed of the high vacuum pump or restoring connectivity between the ion source and the high vacuum pump.

26 Claims, 7 Drawing Sheets

ION SOURCES FOR IMPROVED ROBUSTNESS

FIELD

The present disclosure generally relates to the field of mass spectrometry including ion sources for improved robustness.

INTRODUCTION

Mass spectrometry can be used to perform detailed analyses on samples. Furthermore, mass spectrometry can provide both qualitative (is compound X present in the sample) and quantitative (how much of compound X is present in the sample) data for a large number of compounds in a sample. These capabilities have been used for a wide variety of analyses, such as to test for drug use, determine pesticide residues in food, monitor water quality, and the like.

During use, the sensitivity of a mass spectrometer can degrade over time due to the build-up of dielectric deposits within the ion source. These deposits act as electrical insulators which alter the electric field experienced by ions, and thus the forces acting on them. Susceptible surfaces can include the cavity wherein ions are initially formed, along with various ion-optical components used to extract, guide, and focus ions into an ion guide or mass resolving multipole. In addition to sensitivity loss, mass resolution, mass accuracy and ion abundance ratios may suffer. As such, there is a need for improved ion sources.

DRAWINGS

For a more complete understanding of the principles disclosed herein, and the advantages thereof, reference is now made to the following descriptions taken in conjunction with the accompanying drawings and exhibits, in which.

Figure 3:
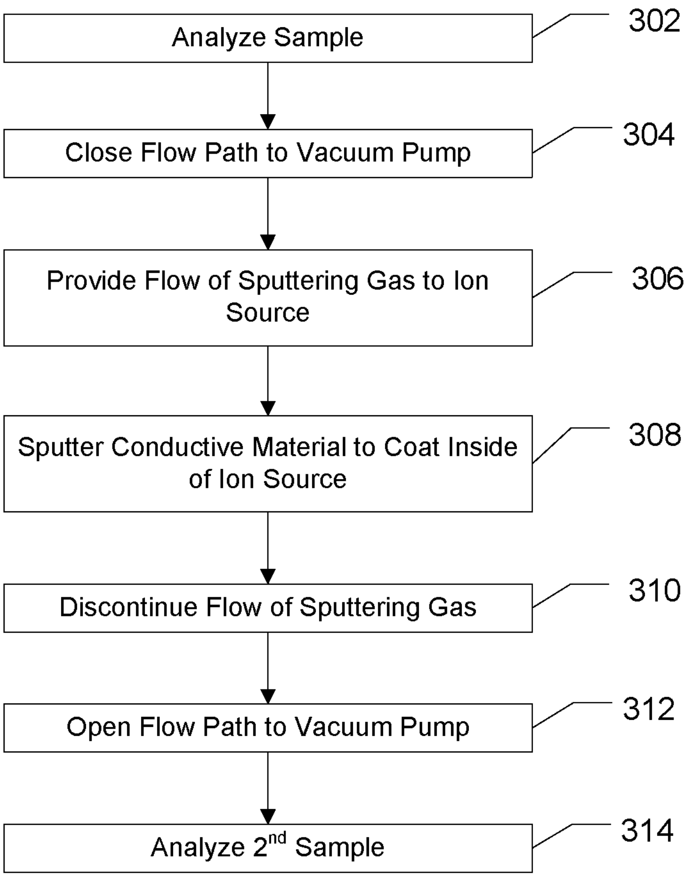
Figure 4:
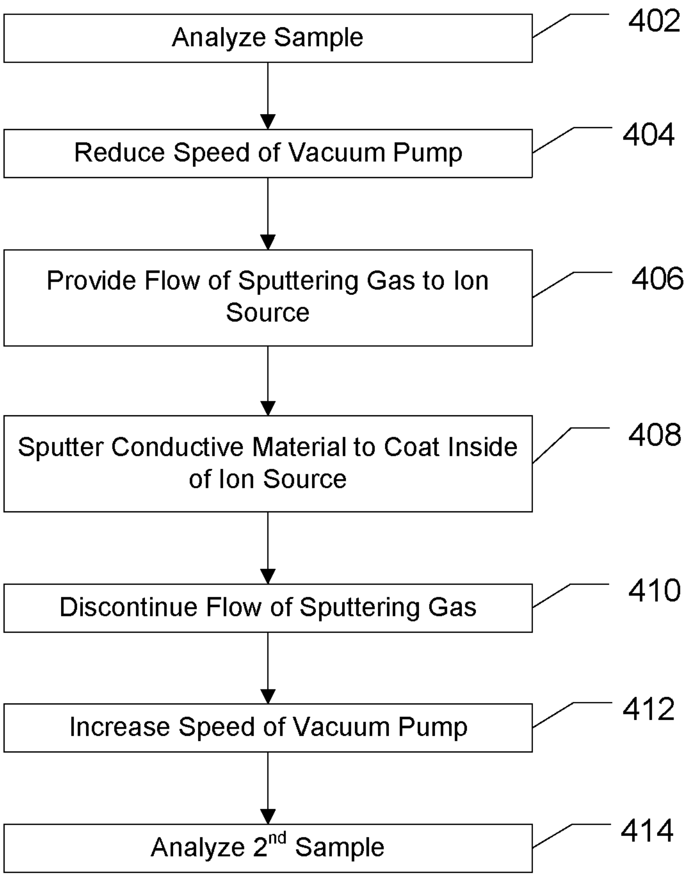
Figure 5:
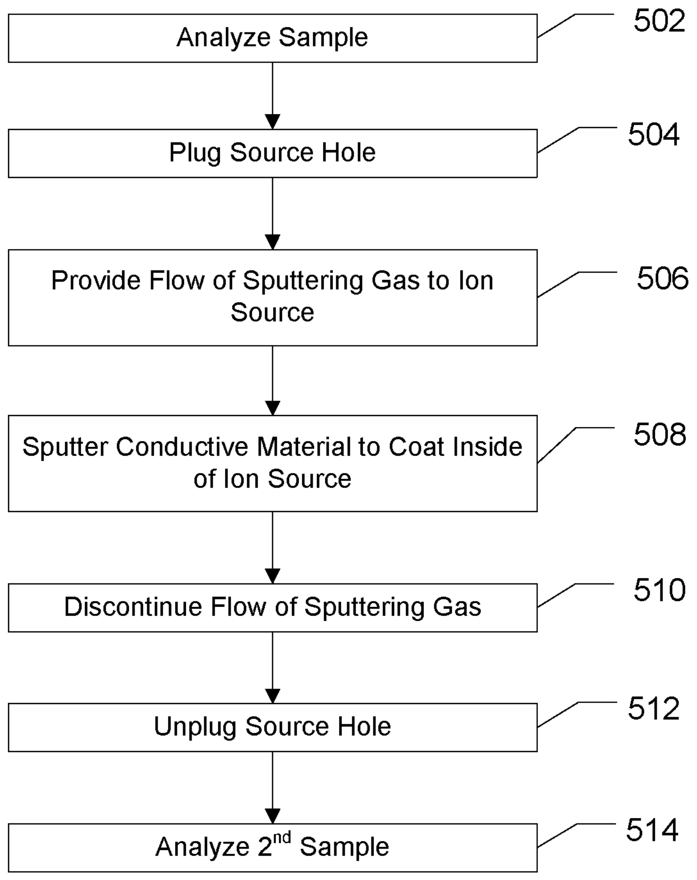

FIGS. 3, 4, and 5 are flow diagrams illustrating exemplary methods of coating the ion source with conductive material, in accordance with various embodiments.

Figure 6:
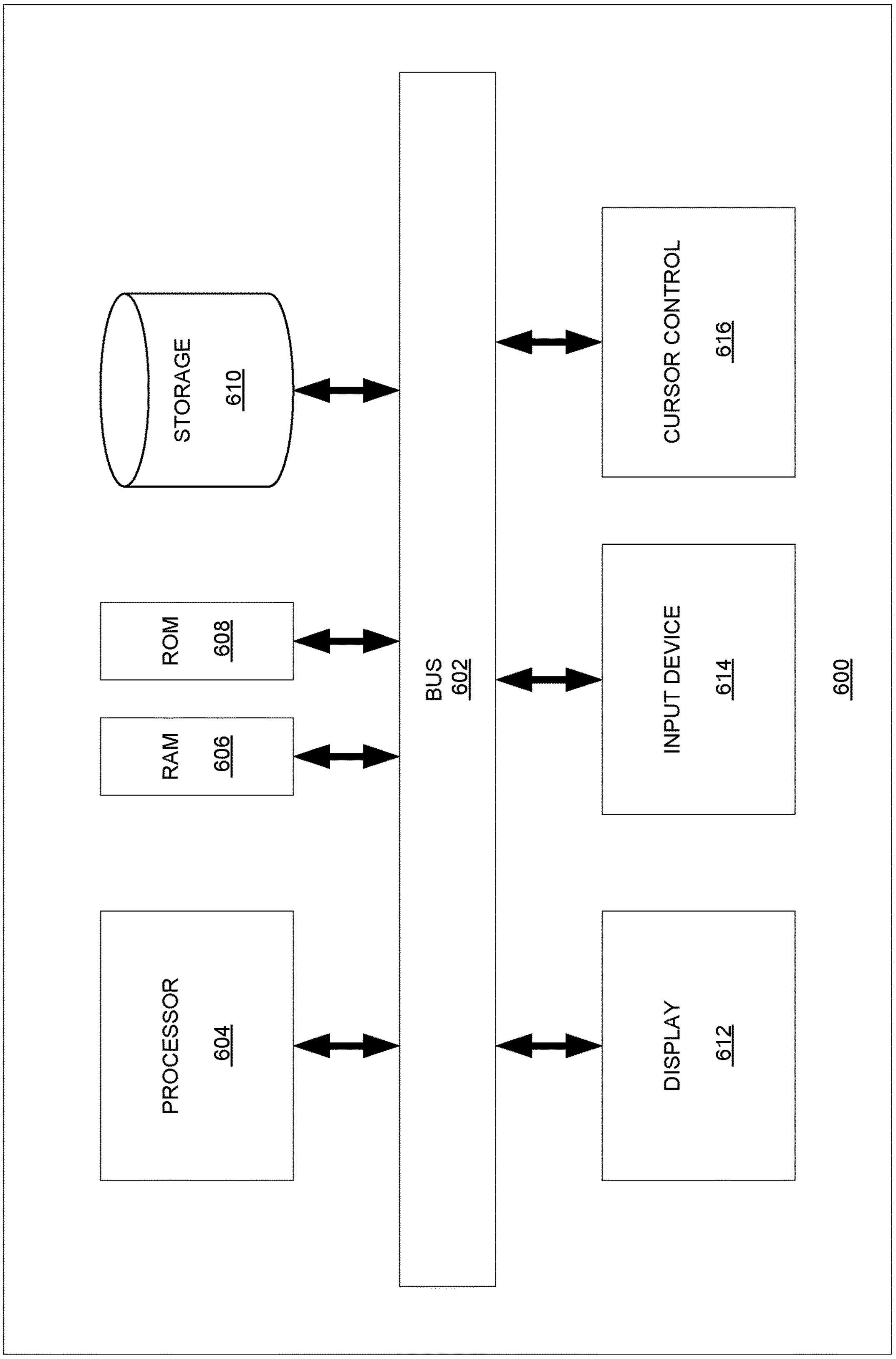

FIG. 6 is a block diagram illustrating an exemplary computer system.

Figure 7:
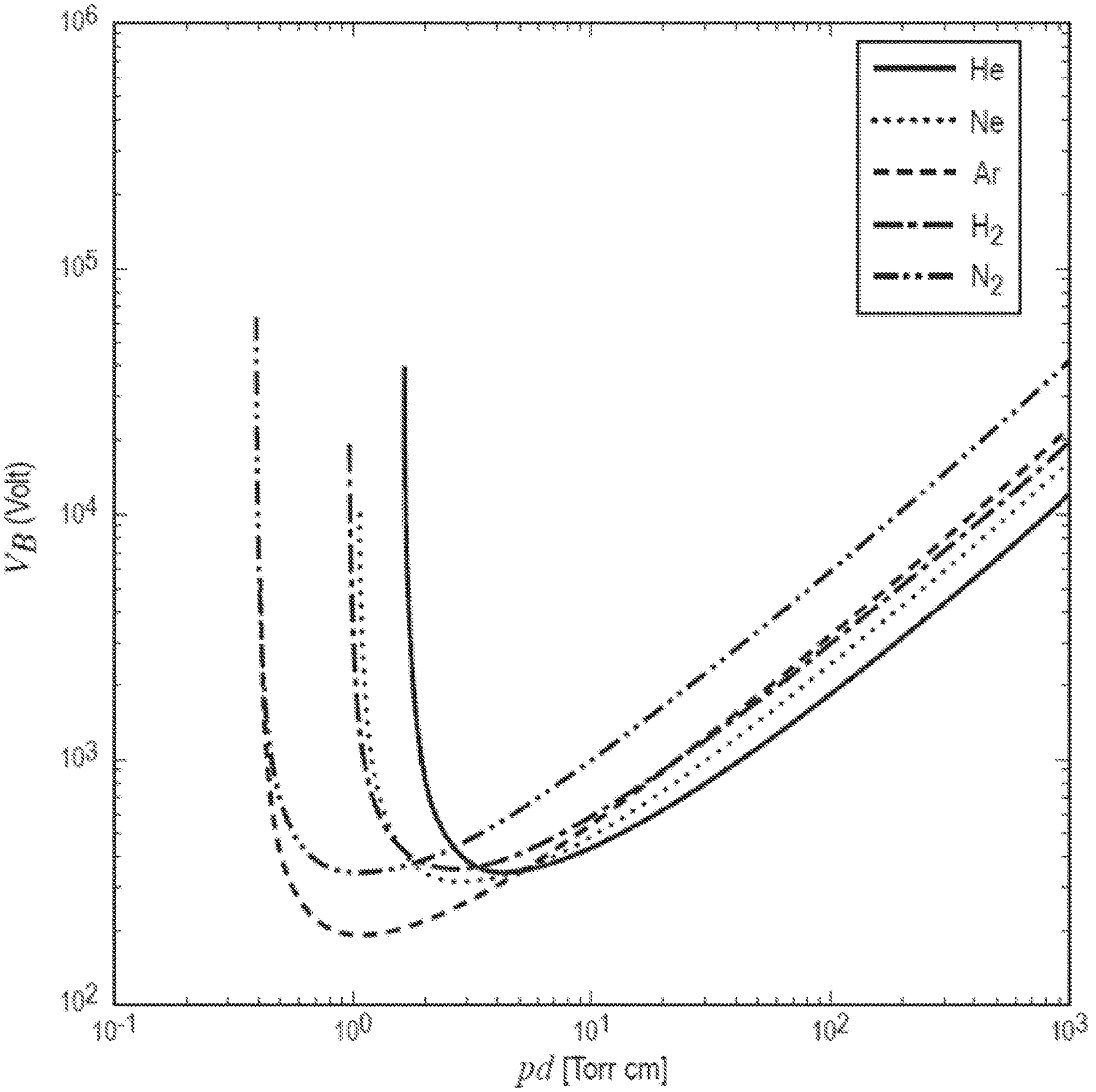

FIG. 7 are Paschen curves for various gasses illustrating Townsend avalanche voltages as a function of electrode spacing multiplied by pressure.

It is to be understood that the figures are not necessarily drawn to scale, nor are the objects in the figures necessarily drawn to scale in relationship to one another. The figures are depictions that are intended to bring clarity and understanding to various embodiments of apparatuses, systems, and methods disclosed herein. Wherever possible, the same reference numbers will be used throughout the drawings to refer to the same or like parts. Moreover, it should be appreciated that the drawings are not intended to limit the scope of the present teachings in any way.

DESCRIPTION OF VARIOUS EMBODIMENTS

Embodiments of systems and methods for ion isolation are described herein and in the accompanying exhibits.

The section headings used herein are for organizational purposes only and are not to be construed as limiting the described subject matter in any way.

In this detailed description of the various embodiments, for purposes of explanation, numerous specific details are set forth to provide a thorough understanding of the embodiments disclosed. One skilled in the art will appreciate, however, that these various embodiments may be practiced with or without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the various embodiments disclosed herein.

All literature and similar materials cited in this application, including but not limited to, patents, patent applications, articles, books, treatises, and internet web pages are expressly incorporated by reference in their entirety for any purpose. Unless described otherwise, all technical and scientific terms used herein have a meaning as is commonly understood by one of ordinary skill in the art to which the various embodiments described herein belongs.

It will be appreciated that there is an implied "about" prior to the temperatures, concentrations, times, pressures, flow rates, cross-sectional areas, etc. discussed in the present teachings, such that slight and insubstantial deviations are within the scope of the present teachings. In this application, the use of the singular includes the plural unless specifically stated otherwise. Also, the use of "comprise", "comprises", "comprising", "contain", "contains", "containing", "include", "includes", and "including" are not intended to be limiting. It is to be understood that both the foregoing general description and the following detailed description are exemplary and explanatory only and are not restrictive of the present teachings.

As used herein, "a" or "an" also may refer to "at least one" or "one or more." Also, the use of "or" is inclusive, such that the phrase "A or B" is true when "A" is true, "B" is true, or both "A" and "B" are true. Further, unless otherwise required by context, singular terms shall include pluralities and plural terms shall include the singular.

A "system" sets forth a set of components, real or abstract, comprising a whole where each component interacts with or is related to at least one other component within the whole.

Mass Spectrometry Platforms

Figure 1:
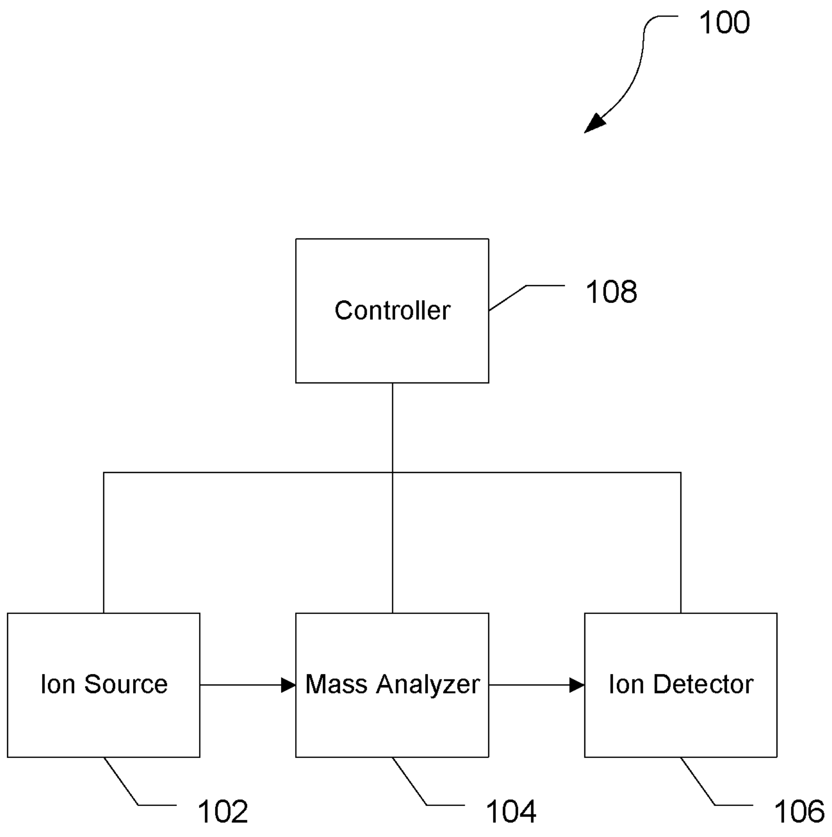
FIG. 1 is a block diagram of an exemplary mass spectrometry system, in accordance with various embodiments.

Various embodiments of mass spectrometry platform 100 can include components as displayed in the block diagram of FIG. 1. In various embodiments, elements of FIG. 1 can be incorporated into mass spectrometry platform 100. According to various embodiments, mass spectrometer 100 can include an ion source 102, a mass analyzer 104, an ion detector 106, and a controller 108.

In various embodiments, the ion source 102 generates a plurality of ions from a sample. The ion source can include, but is not limited to, a matrix assisted laser desorption/ionization (MALDI) source, electrospray ionization (ESI) source, atmospheric pressure chemical ionization (APCI) source, atmospheric pressure photoionization source (APPI), inductively coupled plasma (ICP) source, electron ionization source, chemical ionization source, photoionization source, glow discharge ionization source, thermospray ionization source, and the like.

In various embodiments, the mass analyzer 104 can separate ions based on a mass to charge ratio of the ions. For example, the mass analyzer 104 can include a quadrupole mass filter analyzer, a quadrupole ion trap analyzer, a time-of-flight (TOF) analyzer, an electrostatic trap (e.g., ORBITRAP) mass analyzer, Fourier transform ion cyclotron resonance (FT-ICR) mass analyzer, and the like. In various embodiments, the mass analyzer 104 can also be configured to fragment the ions using collision induced dissociation (CID) electron transfer dissociation (ETD), electron capture dissociation (ECD), photo induced dissociation (PID), surface induced dissociation (SID), and the like, and further separate the fragmented ions based on the mass-to-charge ratio.

In various embodiments, the ion detector 106 can detect ions. For example, the ion detector 106 can include an electron multiplier, a Faraday cup, and the like. Ions leaving the mass analyzer can be detected by the ion detector. In various embodiments, the ion detector can be quantitative, such that an accurate count of the ions can be determined.

In various embodiments, the controller 108 can communicate with the ion source 102, the mass analyzer 104, and the ion detector 106. For example, the controller 108 can configure the ion source or enable/disable the ion source. Additionally, the controller 108 can configure the mass analyzer 104 to select a particular mass range to detect. Further, the controller 108 can adjust the sensitivity of the ion detector 106, such as by adjusting the gain. Additionally, the controller 108 can adjust the polarity of the ion detector 106 based on the polarity of the ions being detected. For example, the ion detector 106 can be configured to detect positive ions or be configured to detected negative ions.

Vacuum System

Figure 2:
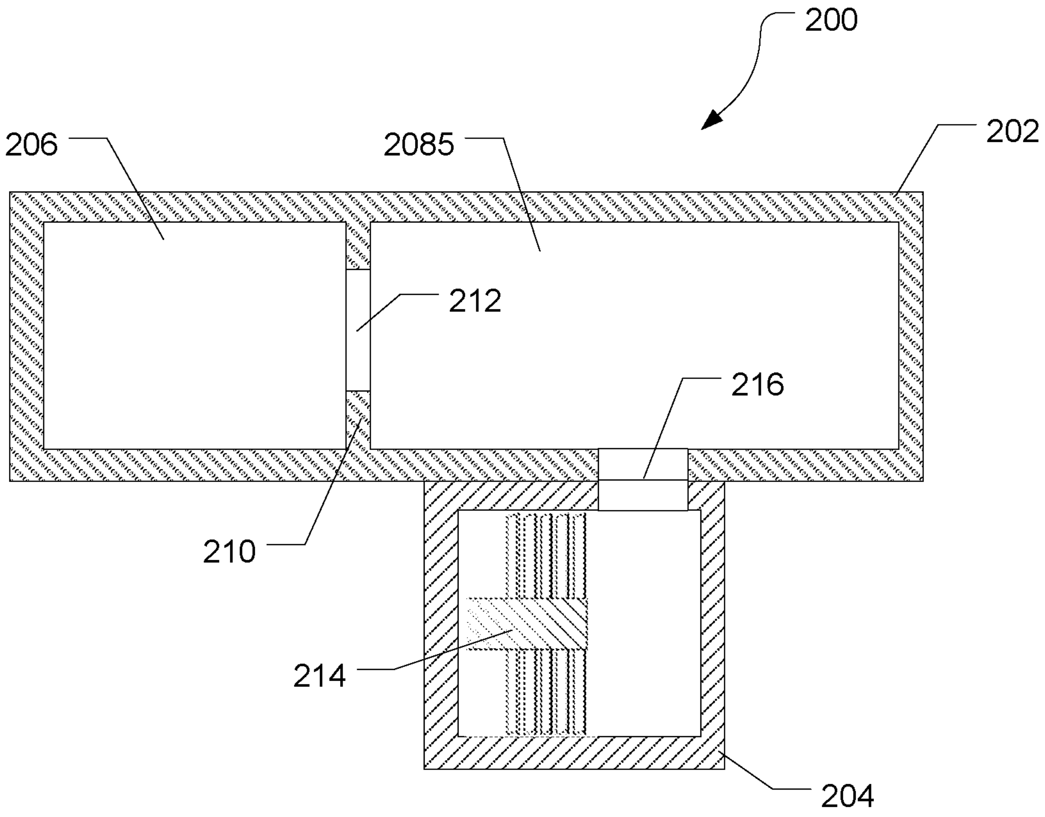
FIG. 2 is a diagram illustrating an exemplary vacuum arrangement in a mass spectrometer, in accordance with various embodiments.

FIG. 2 is cross section view illustrating an exemplary vacuum system 200 for a mass spectrometer. Vacuum system 200 can include mass spectrometer vacuum manifold 202 and high vacuum pump housing 204.

In various embodiments, the mass spectrometer vacuum manifold 202 can define ion source chamber 206 and high vacuum chamber 208. The ion source chamber 206 can house an ion source, such as ion source 102 of FIG. 1, and the high vacuum chamber 208 can house a mass analyzer, such as mass analyzer 104 of FIG. 1, and ion detector, such as ion detector 108 of FIG. 1. In other embodiments, the mass spectrometer vacuum manifold 202 can define one chamber and house the ion source, mass analyzer, and ion detector in the one chamber or have additional chambers such that the ion source, mass analyzer, and ion detector can be housed in separate chambers. In various embodiments, the mass spectrometer vacuum manifold 202 can be a monolithic manifold, such as a manifold machined from a single block of material, or a multi-component manifold, such as a manifold assembled from multiple pieces of material.

Ion source chamber 206 and high vacuum chamber 208 can be separated by a baffle 210 having an aperture 212 therein to connect ion source chamber 206 and high vacuum chamber 208.

High vacuum pump housing 204 can contain high vacuum pump 214. High vacuum chamber 208 can be coupled to high vacuum pump housing 204 via outlet 216.

Methods

FIG. 3 is flow diagram illustrating a method 300 of applying a conductive layer to the interior of the ion source to improve robustness. At 302, a sample can be ionized in an ion source of a mass spectrometer, such as mass spectrometer 100, and the sample can be analyzed.

At 304, the flow path to a high vacuum pump, such as a turbo molecular pump, can be partially or fully closed to increase pressure in the ion source to a pressure suitable for sputtering, such as at least about $1\times10^{-3}$ Torr, preferably at least about 0.1 Torr. In various embodiments, closing the flow path can include at least partially closing the entrance to the high vacuum pump, such as by closing a valve or moving a plate to block at least a portion of the entrance, such as outlet 216 of FIG. 2. In other embodiments, the flow path can be closed at any point along the flow path between the ion source and the high vacuum pump. In some embodiments, it can include isolating the ion source from other parts of the mass spectrometer to maintain vacuum in the rest of the mass spectrometer, such as by closing aperture 212 of FIG. 2. At 306, a flow of sputtering gas can be provided to the ion source. The sputtering gas can include argon, helium, neon, hydrogen, nitrogen, krypton, xenon, or any combination thereof.

At 308, a coating of conductive material can be sputtered onto the interior surface of the ion source to form a conductive layer overtop any buildup of non-conductive material. The conductive material can be a metal such as gold, silver, rhenium, platinum, iridium, chromium, tungsten, molybdenum, copper, nickel chromium alloys, aluminum, titanium, or any combination thereof. The conductive material can be a conductive ceramic such as titanium nitride.

At 310, after coating the inside of the ion source with the conductive layer, the flow of sputter gas can be discontinued, and at 312, the flow path between the ion source and the high vacuum pump can be opened to restore the high vacuum needed for operation of the mass spectrometer.

At 314, a second sample can be analyzed once the pressure has returned to an appropriate operating pressure for the mass spectrometer, such as less than about $1\times10^{-3}$ Torr, preferably less than about $5\times10^{-5}$ Torr.

FIG. 4 is flow diagram illustrating a method 400 of applying a conductive layer to the interior of the ion source to improve robustness. At 402, a sample can be ionized in an ion source of a mass spectrometer, such as mass spectrometer 100, and the sample can be analyzed.

At 404, the speed of a high vacuum pump, such as a turbo molecular pump, can be reduced to increase pressure in the ion source to a pressure suitable for sputtering, such as at least about $1\times10^{-3}$ Torr, preferably at least about 0.1 Torr. At 406, a flow of sputtering gas can be provided to the ion source. The sputtering gas can include argon, helium, neon, hydrogen, nitrogen, krypton, xenon, or any combination thereof.

At 408, a coating of conductive material can be sputtered onto the interior surface of the ion source to form a conductive layer overtop any buildup of non-conductive material. The conductive material can be a metal such as gold, silver, rhenium, platinum, iridium, chromium, tungsten, molybdenum, copper, nickel chromium alloys, aluminum, titanium, or any combination thereof. The conductive material can be a conductive ceramic such as titanium nitride.

At 410, after coating the inside of the ion source with the conductive layer, the flow of sputter gas can be discontinued, and at 412, the speed of the vacuum pump can be increased to restore the high vacuum needed for operation of the mass spectrometer, such as less than about $1\times10^{-3}$ Torr, preferably less than about $5\times10^{-5}$ Torr.

At 414, a second sample can be analyzed once the pressure has returned to an appropriate operating pressure for the mass spectrometer.

FIG. 5 is flow diagram illustrating a method 500 of applying a conductive layer to the interior of the ion source to improve robustness. At 502, a sample can be ionized in an ion source of a mass spectrometer, such as mass spectrometer 100, and the sample can be analyzed.

At 504, the ion source can be isolated from the high vacuum pump. In various embodiments, a probe can be inserted into the ion source to block at least a portion of the opening, such as through a vacuum interlock. In other embodiments, the probe can be housed within the vacuum chamber and repositioned to block the opening. The probe can have an insulative cone shaped distal end for blocking the opening and a conductive shaft material as a source for the sputtered conducting coating. At 506, a flow of sputtering gas can be provided to the ion source. The sputtering gas can include argon, helium, neon, hydrogen, nitrogen, krypton, xenon, or any combination thereof. Blocking the opening and flowing the sputtering gas can increase the pressure within the ion source to a pressure suitable for sputtering, such as at least about $1\times10^{-3}$ Torr, preferably at least about 0.1 Torr.

At 508, a coating of conductive material can be sputtered onto the interior surface of the ion source for form a conductive layer overtop any buildup of non-conductive material. The conductive material can be a metal such as gold, silver, rhenium, platinum, iridium, chromium, tungsten, molybdenum, copper, nickel chromium alloys, aluminum, titanium, or any combination thereof. The conductive material can be a conductive ceramic such as titanium nitride.

At 510, after coating the inside of the ion source with the conductive layer, the flow of sputter gas can be discontinued, and at 512, the opening of the ion source can be opened to reestablish the low pressure needed in the ion source, such as less than $1\times10^{-3}$ Torr, preferably less than about $5\times10^{-5}$ Torr.

At 514, a second sample can be analyzed once the pressure has returned to an appropriate operating pressure for the mass spectrometer.

In various embodiments, the ion source can be coated following a sequence of many samples. However, it may be preferable to sputter the source components quasi-continuously by taking advantage of the time interval between analytical runs. Since the degradation is marginal for any given analytical run, a partial re-coat lasting only several seconds to a minute or two can be executed without interruption of the analytical sequence.

Sputtering Process

FIG. 7 illustrates the well known Pachen curves for various gasses. These curves indicate the breakdown potentials for a given pressure times electrode spacing which results in gas phase currents in the milliampere regime suitable for deposition of conducting films in a reasonable timeframe such as one or two minutes. The actual pressure may vary depending on the electrode spacing employed, but generally is in the range of 0.1 Torr and higher. A suitable method is to apply a high negative potential such as −2.5 kilovolts to a conventional ion source repeller made of or comprising a surface coated with gold. A counter electrode, such as the ion volume or extractor lens is maintained at lower potential such as earth ground in order to establish the necessary electric field. The power supply is preferably operated in current limiting mode with an adjustable current limit of 1 to 10 milliamperes. The pressure can be increased following the termination of potentials on other mass spectrometer components such as conversion dynodes, electron multipliers, ion guides, mass resolving multipoles and the like, in order to prevent unwanted gas discharge resulting in component damage. The pressure is increased until the onset of glow discharge and establishment of the target sputtering current.

Computer-Implemented System

FIG. 6 is a block diagram that illustrates a computer system 600, upon which embodiments of the present teachings may be implemented as which may incorporate or communicate with a system controller, for example controller 68 shown in FIG. 1, such that the operation of components of the associated mass spectrometer may be adjusted in accordance with calculations or determinations made by computer system 600. In various embodiments, computer system 600 can include a bus 602 or other communication mechanism for communicating information, and a processor 604 coupled with bus 602 for processing information. In various embodiments, computer system 600 can also include a memory 606, which can be a random access memory (RAM) or other dynamic storage device, coupled to bus 602, and instructions to be executed by processor 604. Memory 606 also can be used for storing temporary variables or other intermediate information during execution of instructions to be executed by processor 604. In various embodiments, computer system 600 can further include a read only memory (ROM) 608 or other static storage device coupled to bus 602 for storing static information and instructions for processor 604. A storage device 610, such as a magnetic disk or optical disk, can be provided and coupled to bus 602 for storing information and instructions.

In various embodiments, computer system 600 can be coupled via bus 602 to a display 612, such as a cathode ray tube (CRT) or liquid crystal display (LCD), for displaying information to a computer user. An input device 614, including alphanumeric and other keys, can be coupled to bus 602 for communicating information and command selections to processor 604. Another type of user input device is a cursor control 616, such as a mouse, a trackball or cursor direction keys for communicating direction information and command selections to processor 604 and for controlling cursor movement on display 612. This input device typically has two degrees of freedom in two axes, a first axis (i.e., x) and a second axis (i.e., y), that allows the device to specify positions in a plane.

A computer system 600 can perform the present teachings. Consistent with certain implementations of the present teachings, results can be provided by computer system 600 in response to processor 604 executing one or more sequences of one or more instructions contained in memory 606. Such instructions can be read into memory 606 from another computer-readable medium, such as storage device 610. Execution of the sequences of instructions contained in memory 606 can cause processor 604 to perform the processes described herein. In various embodiments, instructions in the memory can sequence the use of various combinations of logic gates available within the processor to perform the processes describe herein. Alternatively hard-wired circuitry can be used in place of or in combination with software instructions to implement the present teachings. In various embodiments, the hard-wired circuitry can include the necessary logic gates, operated in the necessary sequence to perform the processes described herein. Thus implementations of the present teachings are not limited to any specific combination of hardware circuitry and software.

The term "computer-readable medium" as used herein refers to any media that participates in providing instructions to processor 604 for execution. Such a medium can take many forms, including but not limited to, non-volatile media, volatile media, and transmission media. Examples of non-volatile media can include, but are not limited to, optical or magnetic disks, such as storage device 610. Examples of volatile media can include, but are not limited to, dynamic memory, such as memory 606. Examples of transmission media can include, but are not limited to, coaxial cables, copper wire, and fiber optics, including the wires that comprise bus 602.

Common forms of non-transitory computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, PROM, and EPROM, a FLASH-EPROM, any other memory chip or cartridge, or any other tangible medium from which a computer can read.

In accordance with various embodiments, instructions configured to be executed by a processor to perform a method are stored on a computer-readable medium. The computer-readable medium can be a device that stores digital information. For example, a computer-readable medium includes a compact disc read-only memory (CD-ROM) as is known in the art for storing software. The computer-readable medium is accessed by a processor suitable for executing instructions configured to be executed.

In various embodiments, the methods of the present teachings may be implemented in a software program and applications written in conventional programming languages such as C, C++, etc.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

Further, in describing various embodiments, the specification may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the various embodiments.

The embodiments described herein, can be practiced with other computer system configurations including hand-held devices, microprocessor systems, microprocessor-based or programmable consumer electronics, minicomputers, mainframe computers and the like. The embodiments can also be practiced in distributing computing environments where tasks are performed by remote processing devices that are linked through a network.

It should also be understood that the embodiments described herein can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations that form part of the embodiments described herein are useful machine operations. The embodiments, described herein, also relate to a device or an apparatus for performing these operations. The systems and methods described herein can be specially constructed for the required purposes or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Certain embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

What is claimed is:

1. A method comprising:

ionizing a sample using an ion source and analyze the sample using a mass analyzer;

raising the pressure in the ion source to a sputtering pressure by supplying a flow of a sputtering gas and either reducing a speed of a high vacuum pump or isolating the ion source from the high vacuum pump;

sputtering a conductive material on a surface of the ion source;

reducing the pressure in the ion source to an operating pressure by reducing the flow of the sputtering gas and either increasing the speed of the high vacuum pump or restoring connectivity between the ion source and the high vacuum pump; and ionizing a second sample using the ion source and analyze the second sample using the mass analyzer.

2. The method of claim 1 wherein the high vacuum pump is a turbo molecular pump.

3. The method of claim 1 wherein the sputtering gas includes argon, helium, neon, hydrogen, nitrogen, krypton, xenon, or any combination thereof.

4. The method of claim 1 wherein isolating the ion source from the high vacuum pump includes at least partially closing an entrance to the high vacuum pump from a vacuum manifold.

5. The method of claim 4 wherein at least partially closing the entrance to the high vacuum pump includes closing a valve.

6. The method of claim 4 wherein closing the entrance to the high vacuum pump includes moving a plate to block at least a portion of the entrance.

7. The method of claim 1 wherein isolating the ion source from the high vacuum pump includes at least partially closing an opening from the ion source to a vacuum manifold.

8. The method of claim 7 wherein isolating the ion source from the high vacuum pump includes inserting a probe through a vacuum interlock into the ion source having an insulative cone shaped distal end for at least partially blocking the opening, and a conductive shaft material for sputtering.

9. The method of claim 7 wherein at least partially closing the opening from the ion source to the high vacuum pump includes moving a plate to block at least a portion of the opening.

10. The method of claim 9 wherein the plate is comprising the conductive material or is coated in the conductive material.

11. The method of claim 1 wherein the conductive material includes a metal.

12. The method of claim 11 wherein the metal includes gold, silver, rhenium, platinum, iridium, chromium, tungsten, molybdenum, copper, nickel chromium alloys, aluminum, titanium, or any combination thereof.

13. The method of claim 1 wherein the conductive material includes titanium nitride.

14. A mass spectrometer system comprising:

a vacuum manifold;

an ion source positioned within the vacuum manifold for ionizing a sample;

a mass analyzer positioned within the vacuum manifold for analyzing sample ions;

a high vacuum pump connected to the vacuum manifold operable to maintain the pressure within the vacuum manifold at an operating pressure; and a controller configured to:

raise the pressure in the ion source to a sputtering pressure by supplying a flow of a sputtering gas and either reducing a speed of a high vacuum pump or isolating the ion source from the high vacuum pump;

cause a conducting material to be sputtered on a surface of the ion source;

reduce the pressure in the ion source to an operating pressure by reducing the flow of the sputtering gas and either increasing the speed of the high vacuum pump or restoring connectivity between the ion source and the high vacuum pump.

15. The mass spectrometer system of claim 14 wherein the high vacuum pump is a turbo molecular pump.

16. The mass spectrometer system of claim 14 wherein the sputtering gas includes argon, hydrogen, nitrogen, neon, helium, krypton, xenon, or any combination thereof.

17. The mass spectrometer system of claim 14 wherein the conductive material includes a metal.

18. The mass spectrometer system of claim 17 wherein the metal includes gold, silver, rhenium, platinum, iridium, chromium, tungsten, molybdenum, copper, nickel chromium alloys, aluminum, titanium, or any combination thereof.

19. The mass spectrometer system of claim 14 wherein the conductive material includes titanium nitride.

20. The mass spectrometer system of claim 14 wherein the controller is configured to isolate the ion source from the high vacuum pump by at least partially closing an entrance to the high vacuum pump from a vacuum manifold.

21. The mass spectrometer system of claim 20 wherein at least partially closing the entrance to the high vacuum pump includes closing a valve.

22. The mass spectrometer system of claim 20 wherein at least partially closing the entrance to the high vacuum pump includes moving a plate to block at least a portion of the entrance.

23. The mass spectrometer system of claim 14 wherein the controller is configured to isolate the ion source from the high vacuum pump by at least partially closing an opening from the ion source to a vacuum manifold.

24. The mass spectrometer system of claim 23 wherein at least partially closing the opening to the high vacuum pump includes moving a plate to block at least a portion of the opening.

25. The mass spectrometer system of claim 24 wherein the plate is comprising the conductive material or is coated in the conductive material.

26. The mass spectrometer system of claim 14 wherein the controller is configured to isolate the ion source by inserting a probe through a vacuum interlock into the ion source having an insulative cone shaped distal end for at least partially blocking the opening, and a conductive shaft material for sputtering.

* * * * *